United States Patent [19]

Matsumoto

[11] Patent Number: 5,081,347
[45] Date of Patent: Jan. 14, 1992

[54] PHOTOELECTRIC CONVERTING APPARATUS WITH REFLECTION-PREVENTION SECTION

[75] Inventor: Shigeyuki Matsumoto, Atsugi, Japan

[73] Assignee: Canon Kabushiki Kaisha, Tokyo, Japan

[21] Appl. No.: 241,861

[22] Filed: Sep. 8, 1988

[30] Foreign Application Priority Data

Sep. 11, 1987 [JP] Japan ................................. 62-226710
Sep. 6, 1988 [JP] Japan ................................. 63-221252

[51] Int. Cl.⁵ ............................................. H01J 40/14
[52] U.S. Cl. ............................. 250/211 J; 250/208.1; 357/30
[58] Field of Search ............... 250/211 J, 211 R, 578, 250/226, 208.1, 237 R; 357/30 D, 30 H, 34, 24 LR; 358/60, 213.16, 213.19, 213.26, 213.31; 350/339 F, 30 L

[56] References Cited

U.S. PATENT DOCUMENTS

| | | | |
|---|---|---|---|
| 3,763,372 | 10/1973 | Fedotowsky et al. | 250/211 J |
| 4,600,833 | 7/1986 | Shibata et al. | 250/216 |
| 4,682,019 | 7/1987 | Nakatsui et al. | 250/211 R |
| 4,827,118 | 5/1989 | Shibata et al. | 250/211 J |

FOREIGN PATENT DOCUMENTS

| | | |
|---|---|---|
| 0232184 | 12/1987 | European Pat. Off. |
| 3617229 | 11/1987 | Fed. Rep. of Germany |
| 61-075562 | 4/1986 | Japan |
| 61-220460 | 9/1986 | Japan |
| 61-256479 | 11/1987 | Japan |

Primary Examiner—David C. Nelms
Attorney, Agent, or Firm—Fitzpatrick, Cella, Harper & Scinto

[57] ABSTRACT

A photoelectric converting apparatus has a reflection preventing section. The section is formed on at least a peripheral portion of said light receiving section.

59 Claims, 3 Drawing Sheets

PHOTOELECTRIC CONVERTING APPARATUS WITH REFLECTION-PREVENTION SECTION

BACKGROUND OF THE INVENTION

1. Field of the Invention

The present invention relates to a photoelectric converting apparatus having a light receiving section on a substrate and, more particularly, to a photoelectric converting apparatus for preventing a malfunction or the like which is caused due to the light entering from the portions other than a light receiving window.

2. Related Background Art

Figure 1:
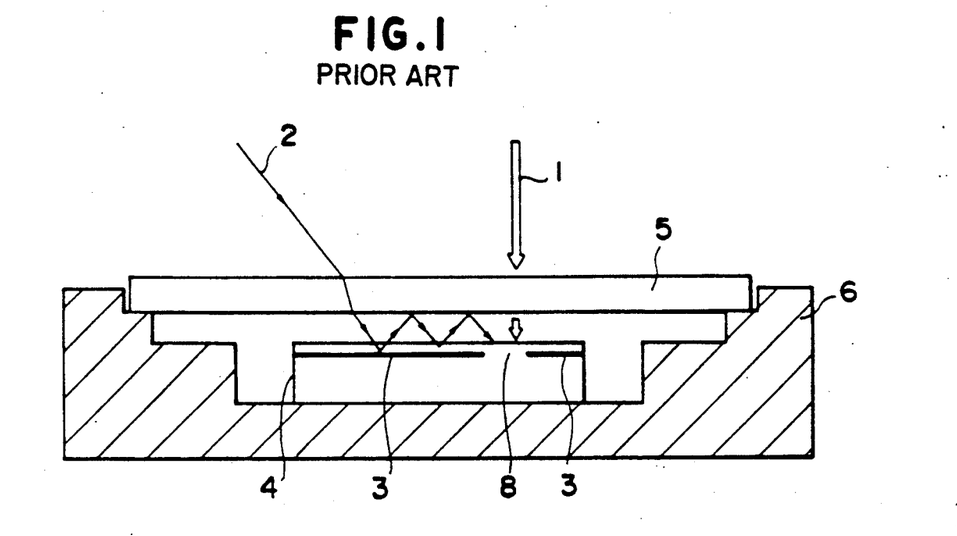
FIGS. 1 and 2 are schematic arrangement diagrams of the first and second examples of a photoelectric converting apparatus relating to the present invention.
Figure 2:
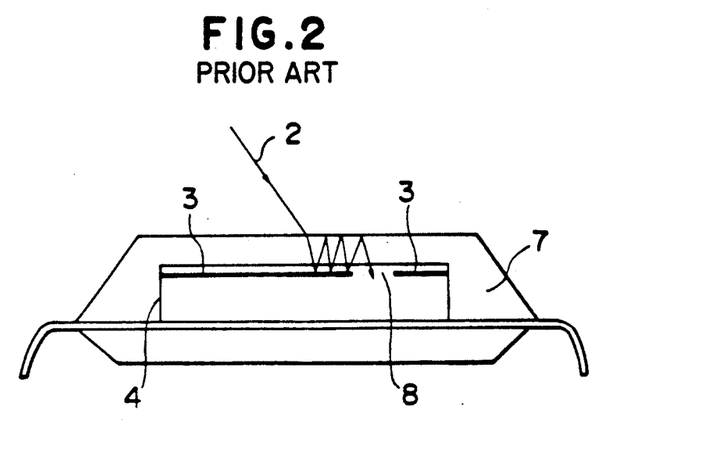

FIGS. 1 and 2 are schematic arrangement diagrams of the first and second examples of a conventional photoelectric converting apparatus.

In FIG. 1, a light shielding layer 3 is formed on the portions of a semiconductor chip 4 having photoelectric converting function excluding a light receiving portion 8. A whole construction is enclosed in a package 6 made of a material such as a plastic, ceramic or the like and sealed by a cover glass 5.

The light shielding layer 3 is provided for allowing necessary light 1 to be received by a semiconductor chip 4 and for shielding the unnecessary light. Al, Al-Si, or the like is used as a material of the light shielding film 3. The layer 3 is formed by a vacuum film forming techniques such as an electron beam evaporation deposition process, sputtering process, CVD process, or the like. Usually, sufficient thickness is about 2000 Å.

However, in the foregoing conventional structure, when unnecessary light flux 2 is incident on a cover glass, it is totally reflected by the light shielding layer 3 and by the inner surface of the cover glass 5 and reach the light receiving section 8, as shown in FIG. 1.

Therefore, a malfunction of the photoelectric converting device in the semiconductor chip 4 occurs, and problem such that the noise figure of the output signal increases raised.

The same problem would be raised in the case of a type wherein the semiconductor chip 4 is enclosed in a clear mold package 7 mold packaging the semiconductor chip 4 having light receiving element with a transparent resin as shown in FIG. 2.

SUMMARY OF THE INVENTION

It is an object of the present invention to provide a photoelectric converting apparatus wherein the foregoing problem is solved.

Another object of the present invention is to solve the problem of the malfunction of the photoelectric conversion device due to unnecessary light incident on the photoelectric conversion section, and to provide a photoelectric conversion device of which noise is reduced.

Still another object of the present invention is to provide photoelectric conversion device of very high reliability of which output changing can be substantially prevented.

Further object of the present invention is to provide photoelectric conversion device having reflection preventing portion at least around the light receiving section.

DETAILED DESCRIPTION OF THE PREFERRED EMBODIMENTS

The photoelectric conversion apparatus according to the present invention has a light reflecting section at least around a light receiving section.

Since the light reflecting section is provided, unnecessary light flux incident on the photoelectric conversion apparatus is absorbed before it encounters the light receiving section. Accordingly, adverse effect to photoelectric conversion operation can be substantially eliminated.

An embodiment of the present invention will be described in detail hereinbelow with reference to the drawings.

Figure 3:
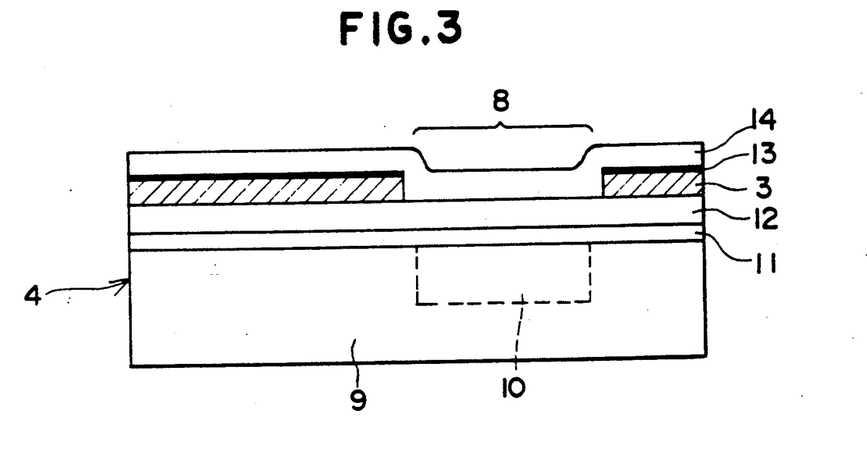
FIGS. 3 to 5 are schematic arrangement diagrams of substantial portion of semiconductor chips in the first to third embodiments of a photoelectric converting apparatus according to the present invention, respectively.
Figure 4:
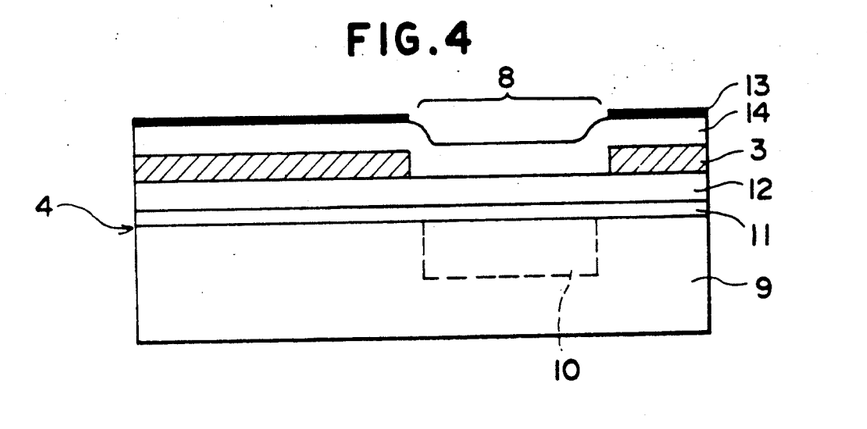

FIGS. 3 and 4 are schematic arrangement diagrams of substantial portion of semiconductor chips in the first to third embodiments of a photoelectric converting apparatus according to the invention, respectively.

In FIG. 3, a photo sensing device 10 (photoelectric conversion element) is formed on the semiconductor substrate 9. An $SiO_2$ layer 11 and an insulative layer 12 between layers are formed on and over the semiconductor substrate 9. Further, the light shielding layer 3 and a reflection preventing layer 13 are formed on and over the portions of the insulative layer 12 excluding the light receiving section 8. An insulative layer 14 between layers is formed on the insulative layer 12 and film 13.

In this embodiment, since the insulative layer 14 is formed on the surface, the light shielding layer 3 and reflection preventing layer 13 are not exposed to the outside, so that the color-fastness property, peeling-off of a film, layer decomposition, and the like are prevented and it is advantageous from the view point of the reliability. On the other hand, in this embodiment, it is also possible to use a method of reducing the reflection factor by the interference effect.

In the semiconductor chip 4 the second embodiment shown in FIG. 4, the reflection preventing layer 13 having the same pattern as the light shielding layer 3 is formed on the insulative layer 14. Thus, the total reflection by the insulative layer 14 can be also prevented.

In this embodiment, since the reflection preventing layer 13 is formed in the final step, it can be formed independently of the deposition conditions such as depositing temperature of the insulative layer 14 and the heat resistance is not particularly required. On the other hand, a film forming apparatus for depositing the insulative layer 14 is not polluted.

Figure 5:
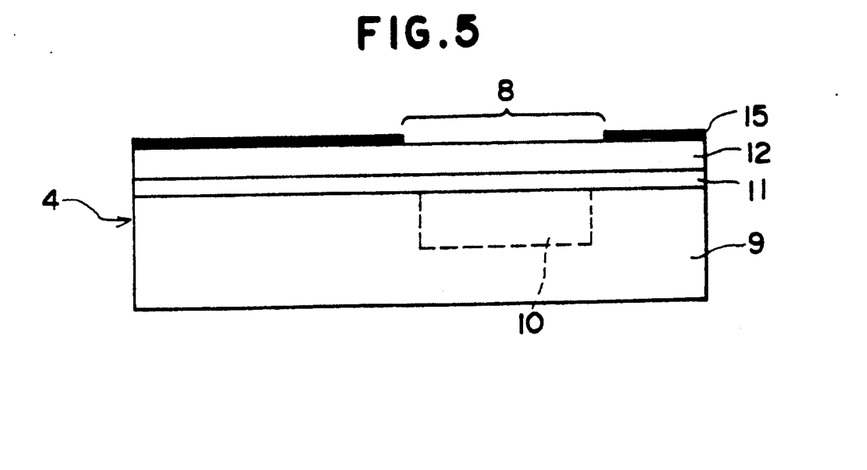

In the semiconductor chip 4 of the third embodiment shown in FIG. 5, a reflection preventing layer 15 also serving as a light shielding film is formed over and on the portions of the $SiO_2$ layer 11 and insulative layer 12 over the semiconductor substrate 9 excluding the light receiving portion 8.

In the third embodiment, with respect to the reflection preventing layer 15 and insulative layer 12, the effect similar to that in the second embodiment is derived.

In addition, in case of the third embodiment as shown in FIG. 5, since only one insulative layer 12 between layers is formed, a warp of the semiconductor substrate 9 can be remarkably reduced. On the other hand, since the light is not reflected by the interface of the insulative layer, the photoelectric converting efficiency is improved. Further, since it is unnecessary to separately form the light shielding layer 3 like the examples as shown in FIGS. 3 and 4, so that the manufacturing is simplified.

When photoelectric conversion apparatus is necessary, a color filter can be formed on the light receiving portion 8 and a layer having a function of light shielding and reflection preventing can be formed on the peripheral portion by the similar steps.

On the other hand, in the second and third embodiments, since the reflection preventing layers 13 and 15 are formed on the most outer shell surface, the total reflection on the surface can be substantially prevented.

When each of the foregoing semiconductor chips 4 of the above embodiment is enclosed in, for instance, a ceramic package or clear mold package, even if the unnecessary light flux 2 enters as in the example as shown in FIGS. 1 and 2, it is absorbed by the reflection preventing layer 13 or 15 and is not introduced into the photo sensing device 10.

Manufacturing methods in the embodiments will now be described.

First, the step of forming the photo sensing device 10 on the semiconductor substrate 9, the step of forming the $SiO_2$ layer 11, the wiring forming step, and the step of forming the insulative layer 12 between layers are common to each of the embodiments.

In the wiring forming step, Al or Al-Si is formed on the $SiO_2$ layer 11 by a sputtering method so as to have a thickness of 0.7 to 1.2 μm. Then, it is patterned to thereby form an aluminum wiring. The insulative layer 12 is made of highly insulative material such as silicon nitride or $SiO_2$. In the case of using silicon nitride, it is formed by a plasma CVD method, using a gas mixture, for example, $SiH_4 + NH_3$, subjecting to layer forming temperatures of 300° to 400° C. and another conditions. A refractive index $nf = 2.01 \pm 0.05$ is achieved. A thickness 4000 to 12000 Å of the layer is desirable.

An $SiO_2$ layer having a thickness of 300 to 2000 Å formed by a CVD method may be laid under silicon nitride as will be explained hereinafter.

In the case of $SiO_2$ layer, the insulative layer 12 is formed using a gas mixture, for example, $SiH_4 + O_2$ at a temperatures of 350° to 450° C. so as to have a thickness of 6000 to 12000 Å by a CVD method.

On the other hand, in the first and second embodiments, the insulative layer 14 may be formed under the same conditions and thickness as those of the insulative layer 12. The light shielding film 3 is formed by depositing a light shielding material such as Al or Al-Si or the like, whose thickness is 1500 Å or more by a sputtering method or electron beam evaporation deposition method, and by eliminating the light receiving portion 8 by the patterning.

The reflection preventing layers 13 and 15 will now be practically explained.

A reflection factor of the reflection preventing layer is set to a small value preferably of 5% or less, more preferably, 1% or less. It is desirable to use the reflection preventing layer which can be easily patterned. Particularly, selecting, as a material of the reflection preventing film, one which can be patterned by the light is desirable. As such desirable material, followings are used.

(1) Photosensitive resin (a) Since a black photosensitive resin has a small reflection factor and can be patterned by the light it can be used as a material of the reflection preventing layer.

Such a photosensitive resin, for example, the resins of the article Nos. PI 2702 and 2703 made by Du Pont Co., Ltd. are available.

(b) Moreover, it is also possible to use as the reflection preventing material a material which is made by mixing the following pigment or dye with a photosensitive resin such as PIQ (photosensitive polyimide, a trade name, made by Hitachi Chemical Co., Ltd.).

As an organic pigment suitable for use, one or two kinds or more are selected from a group of azo system pigments of the soluble azo system, insoluble azo system, condensed azo system, or the like, a phthalocyanine system pigment, and condensed polycyclic system pigments including the indigo system, anthraquinone system, perylene system, perynone system, dioxazine system, quinacridone system, isoindolinone system, phthalone system, methine azomethine system, and other metal complex system and mixed.

On the other hand, it is also possible to use inorganic pigment such as a carbon black, iron black, graphite, or a compound oxide black pigment of the copper chromium system, copper, iron, and manganese system.

As a dye, one, two, or three kinds or more are selected from the dyes of various systems such as azo, anthraquinone, phthalocyanine, carbonium, quinonimine, methine, benzoquinone, naphthoquinone, and the like and mixed.

In the case of an example of a semiconductor chip 4 shown in FIG. 4, after the insulative layer 14 was formed, the photosensitive resin material of (a) or (b) compound is coated to the whole surface by a spin coater and exposed by the ultraviolet rays by using the same mask as the light shielding layer 3. The reflection preventing layer 13 is then formed by developing and rinsing steps. A thickness of 1000 to 10000 Å of the layer is desirable.

The photosensitive resin material also has the light shielding effect because it is black and can be also used as the material of the reflection preventing layer 15 in the third embodiment.

(2) Heat resisting binder system

The mixture made by mixing above-mentioned pigment or dye with an OCD (Trade name: made by Tokyo Applied Chemical Co., Ltd.; the OCD is obtained by binding $SiO_2$ in ethanol and has a concentration of 10% or less) and the resultant mixture is used. Each reflection preventing layer material can be used in one of the first to third embodiments.

Concretely, first, the mixture is coated onto the whole surface by using, for example, the spin coater and baked at temperatures of about 100° to 200° C. in the atmosphere of $N_2$, thereby forming an inorganic silica film containing dye or pigment.

Subsequently, the inorganic silica film is patterned by a photographic etching technique by using the same mask as the light shielding layer 3, thereby forming the reflection preventing layer 13 or 15.

Since the inorganic silica film has the heat resistance, it can be formed in the step before the step of forming the insulative layer 14 in the first embodiment.

The reflection preventing film can be also similarly formed by mixing the foregoing pigment or dye into a heat resisting resin such as polyamide or the like.

(3) Inorganic film

An inorganic film of a low reflectivity made of an inorganic material such as PbS, SnS, CuS, FeO, CuO, or the like is formed by a vacuum depositing method and patterned, so that the reflection preventing layer 13 or 15 can be formed.

On the other hand, a film consisting of Ti or Ti compound is formed and this film is left under the conditions of oxygen flow rate of 5 to 200 cc/min and a pressure of 0.1 to 3.0 Torr and in the plasma of discharge power, 100 to 1000 kW. Thus, the black reflection preventing layer 13 or 15 having fine concave and convex surfaces can be formed.

In addition, as disclosed in JP-B-60-47561, it is also possible to use a method of reducing the reflectivity by the interfering effect. The good result was obtained by depositing a film consisting of Si, TiO, Ge, Cr, Ti, or the like as a material so as to have a thickness based on JP-B-60-47561.

The present invention is not limited to the semiconductor chip 4 configuration in which the reflection preventing layer has been formed as in each of the foregoing embodiments. The similar effect can be derived even when the light shielding layer is formed on a side of package as will be explained hereinbelow.

Figure 6:
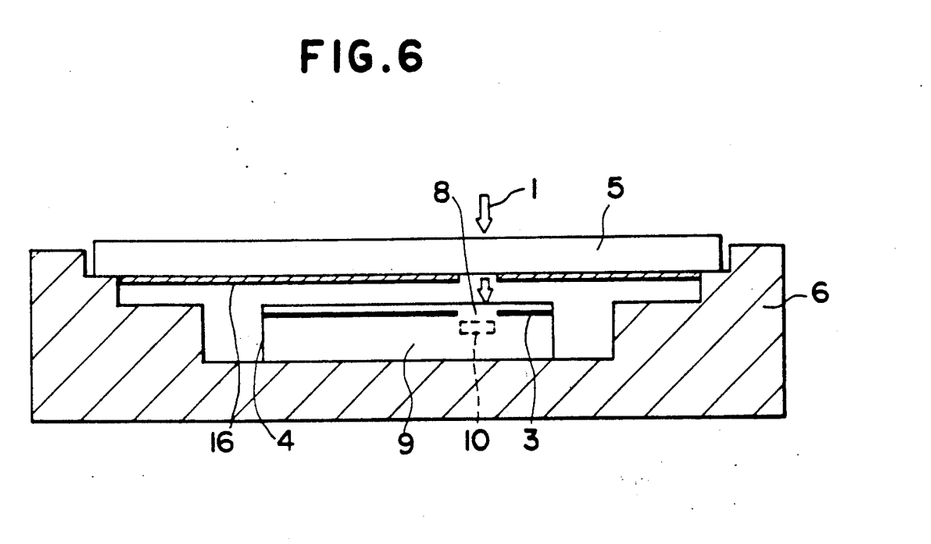
FIGS. 6 and 7 are schematic arrangement diagrams in the fourth and fifth embodiments of the invention, respectively.
Figure 7:
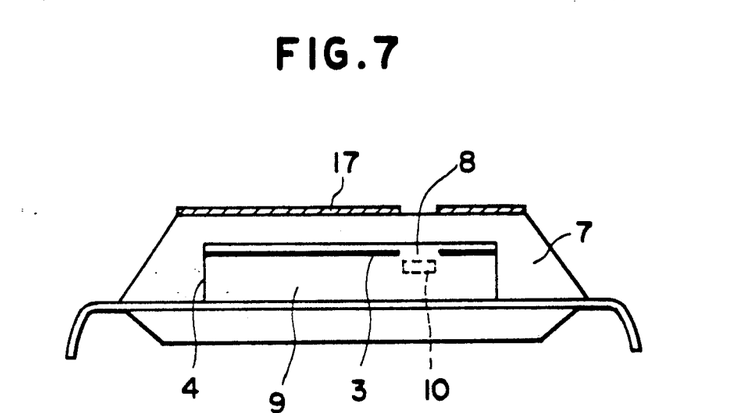

FIGS. 6 and 7 are schematic arrangement diagrams in the fourth and fifth embodiments of the invention, respectively.

In the fourth embodiment shown in FIG. 6, a reflection preventing layer 16 is formed on the inside surface (on a side of semiconductor chip 4) of the cover glass 5 which is a transparent plate of the ceramic package 6. There is no need to form the reflection preventing layer 16 onto the whole surface of the cover glass 5. It is sufficient that the reflection preventing layer 16 is formed on at least the periphery of the light receiving section 8 and can absorb effectively the light 2 which was totally reflected and entered (refer to FIG. 1), thereby preventing reflection. Of course, the transparent plate may be a transparent resin such as acrylic resin.

In the fifth embodiment shown in FIG. 7, a reflection preventing layer 17 is similar to the case of FIG. 6 formed on the upper surface of the clear mold package 7, so that the unnecessary light can be absorbed (refer to FIG. 2).

As described in detail above, in the photoelectric converting apparatus according to the embodiments, by forming the reflection preventing section to at least the peripheral portion of the light receiving section, even if the unnecessary light fluxes enter, they can be absorbed before they reach the light receiving section and an adverse influence on the photoelectric converting operation can be prevented.

Consequently, a malfunction of the photoelectric converting device due to the entrance of the light from the portions other than the light receiving window and a fluctuation of the output can be eliminated. The noise figure of the output is reduced. The reliability of the photoelectric converting apparatus can be improved.

What is claimed is:

1. A photoelectric conversion device comprising:
    a semiconductor substrate having a photoelectric conversion element;
    a transparent plate positioned above said substrate on the side of said substrate from which the light incident upon said light receiving section is provided said transparent plate comprising a material selected from glass and resin; and
    a reflection preventing section provided on at least a peripheral portion of said transparent plate, adjacent said light receiving section, reflection preventing section for absorbing light comprises a resin material.

2. A device according to claim 1, wherein said resin material contains a pigment.

3. A device according to claim 2, wherein said pigment is an organic pigment or an inorganic pigment.

4. A device according to claim 3, wherein
    said organic pigment is at least one selected from azo system, phthalocyanine system, and condensed polycyclic system pigments including indigo system, anthraquinone system, perylene system, perynone system, dioxazine system, quinacridone system, isoindolinone system, phthalone system, methine azomethine system, and metal complex system.

5. A device according to claim 2, wherein
    said inorganic pigment comprises at least one selected from carbon black, iron black, graphite, and compound oxide black pigment of the copper chromium system, copper, iron and manganese system.

6. A device according to claim 1, wherein
    said resin material contains a dye.

7. A device according to claim 6, wherein
    said dye comprises at least one selected from azo, anthraquinone, phthalocyanine, carbonium, quinonimine, methine, benzoquinone, naphthoquinone.

8. A device according to claim 1, wherein
    said resin material contains $SiO_2$.

9. A device according to claim 1, wherein
    said resin material is polyamide.

10. A device according to claim 1, wherein
    said photosensitive resin is a photosensitive polyamide.

11. A device according to claim 1, wherein
    said reflection preventing section is an inorganic layer.

12. A device according to claim 11, wherein
    said inorganic layer comprises a material selected from PbS, SnS, CuS, FeO, CuO, Ti, TiO, Ti-compound, Si, Ge, and Cr.

13. A device according to claim 1, wherein
    said reflection preventing section has a reflectivity lower than 5%.

14. A device according to claim 1,
    further including a light shielding layer for preventing unnecessary light incident on said light receiving section, said light shielding layer being disposed on said reflection preventing section.

15. A device according to claim 14, wherein
    an electrically insulating layer is provided between said light shielding layer and said reflection preventing section.

16. A device according to claim 14, wherein
    said light shielding layer and said reflection preventing section have substantially same configuration.

17. A device according to claim 14, wherein
    said light shielding layer and said reflection preventing section are provided so that they are in contact.

18. A photoelectric conversion device comprising:

a semiconductor substrate having a photoelectric conversion element;

a transparent plate positioned above said semiconductor substrate on the side of said semiconductor substrate from which the light incident upon a light receiving section in said photoelectric conversion element is provided; and a reflection preventing section provided on at least a peripheral portion of said transparent plate having a light shielding layer for preventing unnecessary light incident on said light receiving section, said light shielding layer being disposed on said reflection layer.

19. A packaged photoelectric conversion device comprising a photoelectric conversion element provided on a semiconductor substrate, and a transparent plate provided on a side of light incident on said photoelectric conversion device, wherein a reflection preventing section for absorbing light is provided at least on a peripheral portion of a region of said transparent plate, the region being opposed a light receiving section of said photoelectric conversion element.

20. A device according to claim 19, wherein
said transparent plate comprises a material selected from glass and resin.

21. A packaged photoelectric conversion device comprising:

a semiconductor substrate having a photoelectric conversion element;

a light shielding section above said semiconductor substrate for defining a light receiving section in said photoelectric conversion element upon which light is received;

a transparent plate positioned above said substrate on the side of said substrate from which the light incident upon said light receiving section is provided; and a reflection preventing section provided on said transparent plate between said transparent plate and said light shielding section for absorbing light reflected from said substrate and said light shielding section wherein said reflection preventing section for absorbing light comprises a resin material.

22. A device according to claim 21, wherein
said resin material contains pigment.

23. A device according to claim 22, wherein
said pigment is one selected from organic pigments or inorganic pigments.

24. A device according to claim 23, wherein
said organic pigment is at least one selected from azo system pigment, phthalocyanine system pigment, and condensed polycyclic system pigments including indigo system, anthraquinone system, perylene system, perynone system, dioxazine system, quinacridone system, isoindolinone system, phthalone system, methine azomethine system, and metal complex system.

25. A device according to claim 23, wherein
said inorganic pigment is at least one selected from carbon black, iron black, graphite, and compound oxide black pigment of the copperchromium system, copper, iron and manganese system.

26. A device according to claim 21, wherein said resin material contains dye

27. A device according to claim 26, wherein
said dye comprises at least one selected from azo, anthraquinone, phthalocyanine, carbonium, quinonine, methine, benzoquinone, naphthoquinone 28. A device according to claim 21, wherein
said resin material contains $SiO_2$.

29. A device according to claim 21, wherein said resin material is polyamide.

30. A device according to claim 21, wherein said photosensitive resin is photosensitive polyamide.

31. A device according to claim 21, wherein said reflection preventing section is an inorganic film.

32. A device according to claim 31, wherein
said inorganic film is comprises a material selected from PbS, SnS, CuS, FeO, CuO, Ti, TiO, Ti compound, Si, Ge, and Cr.

33. A device according to claim 21, wherein
said reflection preventing section has a reflectivity lower than 5%.

34. A device according to claim 21, wherein said resin material is a photosensitive resin.

35. A photoelectric conversion device comprising:

a semiconductor substrate including photoelectric conversion element sealed by resin and having at least a transparent portion, wherein a reflection preventing section for absorbing light is provided on at least a peripheral portion of said transparent portion, adjacent a light receiving section of said photoelectric conversion element.

36. A device according to claim 35, wherein
said reflection preventing section is provided on a resin surface sealing said photoelectric conversion element.

37. A photoelectric conversion device comprising a semiconductor substrate including a photoelectric conversion element sealed by resin and having at least a transparent portion, wherein a reflection preventing section for absorbing light is disposed on a surface of said resin sealing said photoelectric conversion element, wherein said reflection preventing section comprises resin material.

38. A photoelectric conversion device according to claim 37, wherein said resin material is a photosensitive resin.

39. A device according to claim 37, wherein
said resin material contains pigment 40. A device according to claim 39, wherein
said pigment is organic dye or inorganic pigment.

41. A device according to claim 40, wherein
said organic pigment is at least one selected from azo system, phthalocyanine system, and condensed polycyclic system pigments including indigo system, anthraquinone system, perylene system, perynone system, dioxazine system, quinacridone system, isoindolinone system, phthalone system, methine azomethine system, and metal complex system.

42. A device according to claim 40, wherein
said inorganic pigment is at least one selected from carbon black, iron black, graphite, and compound oxide black pigment of the copper chromium system, copper, iron and manganese system.

43. A device according to claim 37, wherein
said resin material contains dye.

44. A device according to claim 43, wherein
said dye is at least one selected from azo, anthraquinone, phthalocyanine, carbonium, quinonine, methine, benzoquinone, naphthoquinone.

45. A device according to claim 37, wherein
said resin material contains $SiO_2$.

46. A device according to claim 37, wherein said resin material is polyamide.

47. A device according to claim 37, wherein said photosensitive resin is photosensitive polyamide.

48. A device according to claim 37, wherein said reflection preventing section is inorganic film.

49. A device according to claim 48, wherein said inorganic film is a material selected from PbS, SnS, CuS, FeO, CuO, Ti, TiO, Ti compound, Ge, and Cr.

50. A device according to claim 37, wherein said reflection preventing section has a reflectivity lower than 5%.

51. A packaged photoelectric conversion device comprising:
 a semiconductor substrate including a photoelectric conversion element;
 a light shielding layer above said semiconductor substrate defining a light receiving section in said photoelectric conversion element upon which light is received and presenting unnecessary light incident on said light receiving section;
 a transparent plate positioned above said substrate on a side of said substrate from which the light incident upon said light receiving section is provided;
 a reflection preventing section provided on said transparent plate and said light shielding section for absorbing light from said substrate and said light shielding section; and
 an electrically insulating layer between said light shielding section and said reflection preventing section.

52. A device according to claim 51, including an electrically insulating layer between said light shielding layer and said reflection preventing section.

53. A device according to claim 51, wherein said light shielding layer and said reflection preventing section have substantially the same configuration.

54. A device according to claim 53, wherein said light shielding layer and said reflection preventing section are in contact.

55. A photoelectric conversion device comprising:
 a semiconductor substrate including a photoelectric conversion element sealed by resin and having at least a transparent portion; wherein
 a reflection preventing section for absorbing light is provided on at least a peripheral portion of said transparent portion adjacent a light receiving section of said photoelectric conversion element; wherein
 a light shielding layer for preventing unnecessary light incident on said light receiving section is disposed on said reflection layer.

56. An apparatus according to claim 55, including an insulating layer between said light shielding layer and said reflection preventing section.

57. An apparatus according to claim 55, wherein said light shielding layer and said reflection preventing section have substantially the same configuration.

58. An apparatus according to claim 57, wherein said light shielding layer and said reflection preventing section are in contact.

59. A photoelectric conversion device comprising:
 a semiconductor substrate including a photoelectric conversion element;
 a light shielding section above said semiconductor substrate for defining a light receiving section in said photoconductive conversion element upon which light is received;
 a transparent plate positioned above said semiconductor substrate on the side of said semiconductor substrate from which the light incident upon said light receiving section is provided; and
 a reflection preventing section provided on at least a peripheral portion of said transparent plate between said transparent plate and said light shielding section for absorbing light reflected from said semiconductor substrate and said light shielding section.

* * * * *

UNITED STATES PATENT AND TRADEMARK OFFICE
CERTIFICATE OF CORRECTION

PATENT NO. : 5,081,347

DATED : January 14, 1992

INVENTOR(S) : Shigeyuki Matsumoto

It is certified that error appears in the above-identified patent and that said Letters Patent is hereby corrected as shown below:

On the title page:

IN [56] REFERENCES CITED

Under FOREIGN PATENT DOCUMENTS, "61-256479  11/1987  Japan" should read --62-256479  11/1987  Japan--.

COLUMN 1

Line 34, "reach" should read --reaches--.
Line 39, "raised." should read --is raised.--.

COLUMN 2

Line 18, "effect" should read --effects--.

COLUMN 3

Line 9, "so that" should be deleted.
Line 41, "subjecting" should read --subjected--.
Line 42, "another" should read --other--.

COLUMN 4

Line 1, "followings" should read --the following--.
Line 24, "methine azomethine" should read --methine·azomethine--.

COLUMN 6

Line 3, "provided" should read --provided,--.
Line 8, "section, reflection" should read --section, said reflection--.

UNITED STATES PATENT AND TRADEMARK OFFICE
CERTIFICATE OF CORRECTION

PATENT NO. : 5,081,347

DATED : January 14, 1992

INVENTOR(S) : Shigeyuki Matsumoto

It is certified that error appears in the above-identified patent and that said Letters Patent is hereby corrected as shown below:

COLUMN 6

Line 22, "ine azomethine" should read --ine·azomethine--.
Line 64, "same" should read --the same--.

COLUMN 7

Line 21, "opposed" should read --opposed to--.
Line 58, "methine azomethine" should read --methine·azomethine--.
Line 64, "copperchromium" should read --copper chromium--.

COLUMN 8

Line 13, "is" should be deleted.
Line 22, "photoelectric" should read --a photoelectric--.
Line 45, "pigment" should read --pigment.--.
Line 55, "ine azomethine" should read --ine·azomethine--.

COLUMN 9

Line 23, "presenting" should read --preventing--.

COLUMN 10

Line 16, "An apparatus" should read --A device--.
Line 17, "insulating" should read --electrically insulating--.

UNITED STATES PATENT AND TRADEMARK OFFICE
CERTIFICATE OF CORRECTION

PATENT NO. : 5,081,347

DATED : Janaury 14, 1992

INVENTOR(S) : Shigeyuki Matsumoto

It is certified that error appears in the above-identified patent and that said Letters Patent is hereby corrected as shown below:

COLUMN 10

Line 19, "An apparatus" should read --A device--.
    Line 22, "An apparatus" should read --A device--.

Signed and Sealed this

Twenty-second Day of June, 1993

Attest:

MICHAEL K. KIRK

*Attesting Officer*      *Acting Commissioner of Patents and Trademarks*